(12) United States Patent
Otremba et al.

(10) Patent No.: US 11,355,424 B2
(45) Date of Patent: Jun. 7, 2022

(54) MULTI-CHIP PACKAGE

(71) Applicant: Infineon Technologies AG, Neubiberg (DE)

(72) Inventors: Ralf Otremba, Kaufbeuren (DE); Teck Sim Lee, Melaka (MY); Lee Shuang Wang, Melaka (MY); Mohd Hasrul Zulkifli, Selangor (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/012,198

(22) Filed: Sep. 4, 2020

(65) Prior Publication Data

US 2021/0074614 A1 Mar. 11, 2021

(30) Foreign Application Priority Data

Sep. 5, 2019 (EP) .................................... 19195615

(51) Int. Cl.
*H01L 23/495* (2006.01)
*H01L 23/31* (2006.01)
*H01L 23/00* (2006.01)

(52) U.S. Cl.
CPC .... *H01L 23/49568* (2013.01); *H01L 23/3107* (2013.01); *H01L 23/4952* (2013.01); *H01L 23/49524* (2013.01); *H01L 23/49562* (2013.01); *H01L 23/49575* (2013.01); *H01L 24/40* (2013.01); *H01L 24/48* (2013.01); *H01L 24/73* (2013.01); *H01L 2224/40139* (2013.01);

(Continued)

(58) Field of Classification Search
CPC ......... H01L 23/49562; H01L 23/49575; H01L 24/40; H01L 24/48
See application file for complete search history.

(56) References Cited

U.S. PATENT DOCUMENTS

2001/0040277 A1* 11/2001 Lam ........................ H01L 24/37
257/675
2007/0040252 A1* 2/2007 Hosseini ................. H01L 24/37
257/676

(Continued)

FOREIGN PATENT DOCUMENTS

DE 102015101674 A1 8/2016
DE 102015120396 A1 6/2017

*Primary Examiner* — Michele Fan
(74) *Attorney, Agent, or Firm* — Murphy, Bilak & Homiller, PLLC (57) ABSTRACT

A package includes a package body with a package top side, package footprint side and package sidewalls extending from the package footprint side to the package top side; power semiconductor chips electrically connected in parallel and each having first and second load terminals and being configured to block a blocking voltage and conduct a chip load current between the load terminals; a lead frame structure configured to electrically and mechanically couple the package to a carrier with the package footprint side facing the carrier, the lead frame structure including first outside terminals extending out of the package body for interfacing with the carrier. Each first load terminal is electrically connected, at least by one package body internal connection member, to at least two of the first outside terminals. A horizontally extending conduction layer at the package top side or footprint side is electrically connected with each second load terminal.

18 Claims, 6 Drawing Sheets

(52) U.S. Cl.
CPC ............... *H01L 2224/48245* (2013.01); *H01L 2224/73221* (2013.01)

(56) References Cited

U.S. PATENT DOCUMENTS

| | | | |
|---|---|---|---|
| 2007/0200250 A1* | 8/2007 | Koenigsberger | ............................ H01L 23/49562 257/778 |
| 2009/0051018 A1* | 2/2009 | Moline | ................... H01L 24/36 257/675 |
| 2009/0174043 A1* | 7/2009 | Pruitt | ...................... H01L 24/49 257/673 |
| 2011/0221005 A1 | 9/2011 | Luo et al. | |
| 2011/0284997 A1* | 11/2011 | Gong | ...................... H01L 24/40 257/666 |
| 2014/0030853 A1* | 1/2014 | Desbiens | ............ H01L 23/4824 438/123 |
| 2021/0143106 A1* | 5/2021 | Koduri | .............. H01L 23/49838 |

\* cited by examiner

MULTI-CHIP PACKAGE

TECHNICAL FIELD

This specification refers to embodiments of a package enclosing a plurality of power semiconductor chips and to embodiments of system for supplying a load current to a load, said system including a package enclosing a plurality of power semiconductor chips. In particular, this specification refers to embodiments of a Surface-Mount Device (SMD) package with Top Side Cooling, said package enclosing a plurality of power semiconductor chips, and to embodiments of a system including such package.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises one or more power semiconductor chips, each configured to conduct a load current along a load current path between two load terminals of the respective chip. Further, the load current path may be controlled, e.g., by means of an insulated electrode, sometimes referred to as gate electrode. For example, upon receiving a corresponding control signal from, e.g., a driver, the control electrode may set the power semiconductor chip in one of a conducting state and a blocking state.

After the power semiconductor chip has been manufactured, it is usually installed within in a package, e.g., in a manner that allows the package with the chip(s) to be arranged within an application, e.g., in a power converter or power supply system, e.g., such that the chip(s) may be coupled, as part of the package, to a carrier, e.g., a printed circuit board (PCB).

To this end, a technology commonly referred to as surface-mount technology (SMT) is known, wherein this notion may generally refer to producing electronic circuits in which the components are mounted or placed directly onto the surface of a PCB. Such a component is hence referred to as surface-mount-device (SMD) component.

Another mounting configuration is the so-called through-hole technology, e.g., a construction method of fitting components with wire leads into holes in a circuit board.

Generally, an SMD component can be smaller than its through-hole counterpart. Nevertheless, both technologies are still used nowadays.

A package may have short pins or leads of various styles, flat contacts (also known as "terminal pads"), a matrix of solder balls (e.g., a so-called Ball Grid Array (BGA)), and/or terminations on the package body of the component.

Exemplary configurations of an SMD package are known from documents DE 10 2015 101 674 A1 and DE 10 2015 120 396 A1.

Each of these known SMD packages encloses a power semiconductor chip and has a package body with a package top side, a package footprint side and package sidewalls, wherein the package sidewalls extend from the package footprint side to the package top side. The chip has a first load terminal and a second load terminal and is configured to block a blocking voltage applied between said load terminals.

The above identified known SMD packages each further comprise a lead frame structure for electrically and mechanically coupling the package to a support with the package footprint side facing to the support. The lead frame structure comprises outside terminals extending out of the package sidewall and electrically connected with the first load terminal of the chip. Further, each of the packages comprise a top layer arranged at the package top side and being electrically connected with the second load terminal of the chip.

Accordingly, each of these SMD packages known from documents DE 10 2015 101 674 A1 and DE 10 2015 120 396 A1 may exhibit a package top side that faces away from the support and that is equipped with a top layer to which a heat dissipation device, e.g., a heat sink, may be mounted. Thereby, heat can be removed away from the package that encloses the chip. Such kind of packages may hence be referred to as a SMD-Top Side Cooling (SMD-TSC) packages.

The primary function of the components fulfilling heat dissipation is to remove heat away from the package body. To this end, it is for example known to couple a heat sink to the top layer, e.g., by means of an intermediate component, such as a heat spreader. The heat sink may be electrically insulated from the top layer.

Of course, the dimension and/or configuration of the means for dissipating heat of the package correlate with the heat generated by the chip(s) that operate(s) within the package, i.e., the losses generated by the chip(s) during operation. For example, such losses occur during switching event (so-called switching losses) and during load current conduction (so-called on-state losses or static losses). Losses that may occur during constant off-state (blocking state) of the chip(s) are rather significantly lower than the switching losses and the on-state losses.

The configuration of the package (and/or the heat dissipation device(s) coupled thereto) typically correlate with the amount of power losses generated within the package body, i.e., by the one or more chips included therein. The higher the losses, the larger/the more complex the package (and/or the heat dissipation device(s) coupled thereto) has to be designed.

Low on-state losses or static losses can be achieved by connecting and operating several power semiconductor chips in parallel, because the total on-state resistance of the parallel connected chips is reduced as compared to an individual on-state resistance of one chip.

SUMMARY

Certain aspects of the present specification are related to embodiments of a package that includes at least two separate power semiconductor chips connected in parallel to each other, thereby achieving a package with a comparatively small total on-state resistance ($R_{on}$) and, correspondingly, with comparatively small static losses.

Exemplary embodiments of the package disclosed herein are surface-mount device (SMD) packages, e.g., SMD-TSC packages. Other embodiments of the packages are configured in accordance with the through-hole technology, e.g., packages in accordance with other embodiments are based on the SIP (single in-line package) or DIP (dual in-line package) or DIPP (dual in-line pin package) technology. Further exemplary embodiments of the package disclosed herein are leadless packages.

In accordance with a first embodiment, a package comprises a package body with a package top side, a package footprint side and package sidewalls, the package sidewalls extending from the package footprint side to the package top side; a plurality of power semiconductor chips electrically connected in parallel to each other, each power semiconductor chip having a first load terminal and a second load terminal and being configured to block a blocking voltage applied between said load terminals and to conduct a chip load current between said load terminals; a lead frame structure for electrically and mechanically coupling the package to a carrier with the package footprint side facing to the carrier, the lead frame structure comprising a plurality of first outside terminals. Each first outside terminal extends out of the package body for interfacing with the carrier. Each first load terminal of the plurality of power semiconductor chips is electrically connected, at least by means of one package body internal connection member, to at least two of the plurality of first outside terminals. The package further comprises a horizontally extending conduction layer at the package top side or at the package footprint side, wherein the conduction layer is electrically connected with each of the second load terminals of the plurality of power semiconductor chips.

In accordance with a second embodiment, a system for supplying a load current to a load is presented. The system comprises a power supply, a power supply path for coupling the power supply to the load; and a system main switch in the power supply path, wherein the system main switch comprises one or more packages in accordance with the first embodiment, wherein the one or more packages are configured to conduct the load current.

In accordance with a further embodiment, a method of processing a package is provided. The method includes:
  Providing a package body with a package top side, a package footprint side and package sidewalls, the package sidewalls extending from the package footprint side to the package top side;
  Arranging a plurality of power semiconductor chips in the package body and electrically connecting the chips in parallel to each other, each power semiconductor chip having a first load terminal and a second load terminal and being configured to block a blocking voltage applied between said load terminals and to conduct a chip load current between said load terminals;
  Providing a lead frame structure for electrically and mechanically coupling the package to a carrier with the package footprint side facing to the carrier, the lead frame structure comprising a plurality of first outside terminals, wherein
    each first outside terminal extends out of the package body for interfacing with the carrier;
    each first load terminal of the plurality of power semiconductor chips is electrically connected, at least by means of one package body internal connection member, to at least two of the plurality of first outside terminals; and
  Providing a horizontally extending conduction layer at the package top side or at the package footprint side, wherein the conduction layer is electrically connected with each of the second load terminals of the plurality of power semiconductor chips.

Features of optional further embodiments are defined in the dependent claims. These features may be combined with each other for forming yet further embodiments, if not explicitly stated otherwise.

DETAILED DESCRIPTION

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a chip. For example, both the (first) lateral direction X and the (second) lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip. For example, the extension direction Z mentioned below may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of the device described herein. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor chip, e.g., a power semiconductor chip that may be used within a power converter or a power supply. Thus, in an embodiment, such chip can be configured to carry a load current that is to be fed to a load and/or, respectively, that is provided by a power source. For example, the chip may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. A plurality of such diode cells and/or such transistor cells may be integrated in the chip.

The term "power semiconductor chip" as used in this specification intends to describe a single chip with high voltage blocking and/or high current-carrying capabilities. In other words, such power semiconductor chip is intended for high current, typically in the Ampere range, e.g., up to 5 or 100 Amperes or even up to 1.000 A and above, and/or voltages typically above 15 V, more typically up to 40 V, and above, e.g., up to at least 500 V or more than 500 V, e.g. at least 600 V, or even up to 2.000 V and above.

For example, the power semiconductor chip described below may be a chip that is configured to be employed as a power component in a low-, medium- and/or high voltage application.

For example, the term "power semiconductor chip" as used in this specification is not directed to logic semiconductor devices that are used for, e.g., storing data, computing data and/or other types of semiconductor-based data processing.

Figure 2:
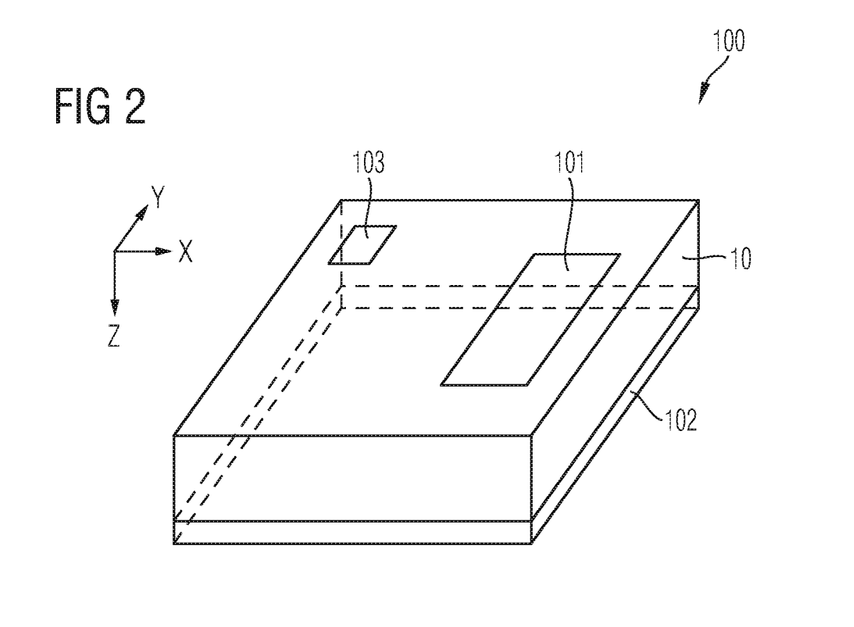
FIG. 2 schematically and exemplarily illustrates a section of a perspective projection of a power semiconductor chip in accordance with one or more embodiments.

FIG. 2 schematically and exemplarily illustrates a section of a perspective projection of a power semiconductor chip 100 in accordance with one or more embodiments.

The power semiconductor chip 100 has a first load terminal 101 and a second load terminal 102. The power semiconductor chip 100 is configured to block a blocking voltage applied between said load terminals 101, 102 and to conduct a chip load current between said load terminals 101, 102.

The power semiconductor chip 100 may have been processed, together with other power semiconductor chips, within a semiconductor wafer which has been diced into the individual power semiconductor chips after completion of the wafer processing.

For example, during such wafer processing, the first load terminal 101 is formed for each designated chip, e.g., by depositing an electrically conductive material, e.g. a metal, on a front side of the wafer. Forming the first load terminals 101 on the front side of the wafer may include using a mask. The first load terminals 101 are typically formed after the configuration of the semiconductor body 10 is finished.

The second terminal 102 is typically formed on a backside of the wafer, e.g., without a mask but substantially homogeneously along the entire back side. For example, the second load terminal 102 may include a backside metallization.

Hence, the chip 100 can have a vertical configuration, according to which the first load terminal 101 is arranged at the chip front side and the second load terminal 102 is arranged at a chip backside. In lateral directions, e.g., in the lateral directions X and Y and linear combinations thereof, the chip may be terminated by a chip edge, e.g., a side surface extending in the vertical direction Z.

The semiconductor body 10 is coupled between the first load terminal 101 and the second load terminal 102. For example, if a voltage applied between the first load terminal 101 and the second load terminal 102 is positive (e.g., the electrical potential of the second load terminal 102 being greater than the electrical potential of the first load terminal 101), the semiconductor body 10 conducts the (forward) load current between the load terminals 101 and 102. If the voltage is negative, the semiconductor body 10 may be configured to block such voltage and inhibit a flow of the load current between the load terminals 101, 102; i.e., the chip 100 can have a reverse blocking configuration. In another embodiment, the chip 100 has a reverse conducting (RC) configuration.

For example, the power semiconductor chip 100 may be a diode, wherein, for example, the first load terminal 101 can be a cathode terminal and the second load terminal 102 can be an anode terminal.

In another embodiment, the power semiconductor chip 100 can be a controllable power semiconductor chip, such as a transistor or a gated diode or a thyristor or a derivative of one of the aforementioned variants. For example, the power semiconductor chip 100 may comprise a control terminal 103, which is typically arranged also at the front side of the power semiconductor chip 100. In an embodiment, the first load terminal 101 may hence be a source/emitter terminal, and the second load terminal 102 may be a drain/collector terminal.

The possible basic configurations of the power semiconductor chip 100 (transistor (e.g., MOSFET, IGBT etc.), diode and thyristor) are known to the skilled person and, hence, it is refrained from explaining these in more detail. Embodiments described herein are not limited to a specific type of a power semiconductor chip. For example, the chips may also be designed as monolithic bidirectionally blocking and conducting power semiconductor chips. For example, each of the chips can be a Si-, SiC-MOSFET or a GaN-HEMT (high-electron-mobility transistor).

Further, it shall be noted that the first load terminal 101 could also be arranged at the back side of the power semiconductor chip 100, and that the second load terminal 102 could also be arranged at the front side of the power semiconductor chip 100.

For example, the chips 100 that are included in the package 200 (described below) each have the same MOSFET configuration.

Before being able to be employed within an application, the power semiconductor chip 100 is usually included within a package that may allow mechanically mounting and electrically connecting the chip within the application, e.g., also for heat distribution purposes. Such package may environmentally seal the included power semiconductor chip 100.

Figure 1A:
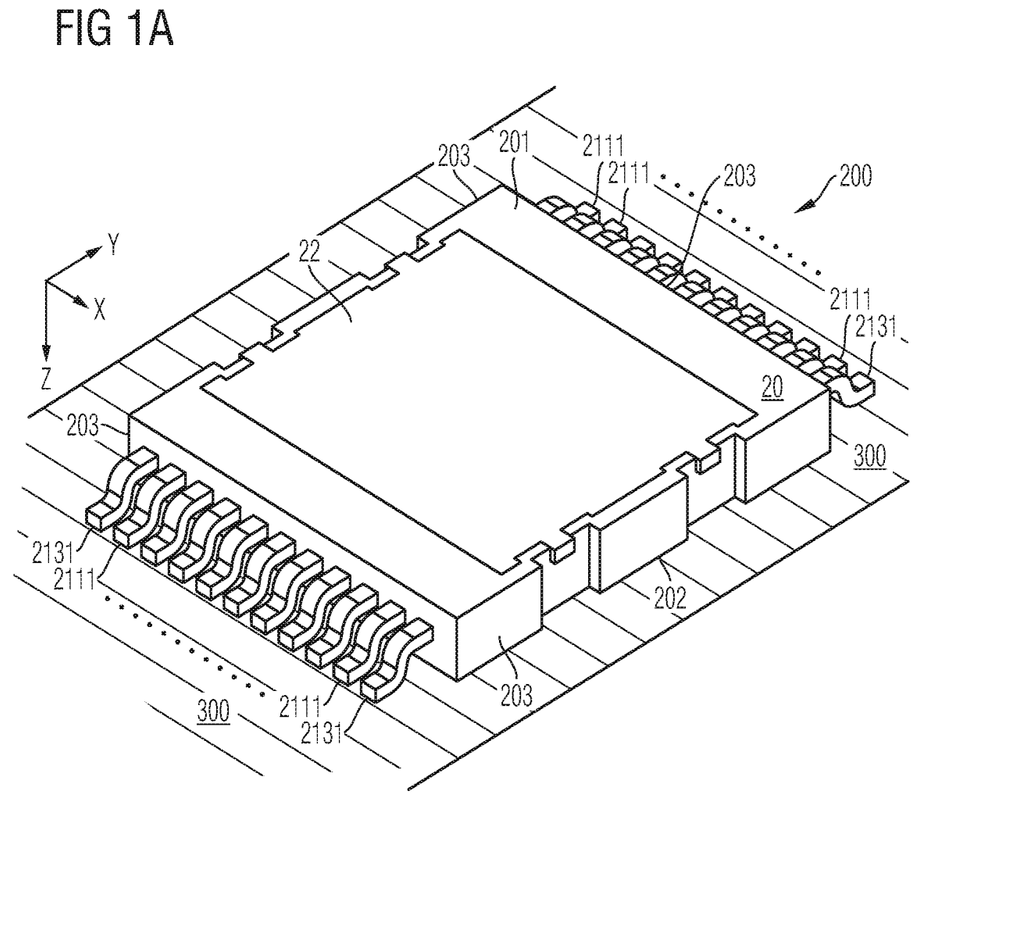
FIGS. 1A-B both schematically and exemplarily illustrate a section of a perspective projection of a package in accordance with one or more embodiments.
Figure 1B:
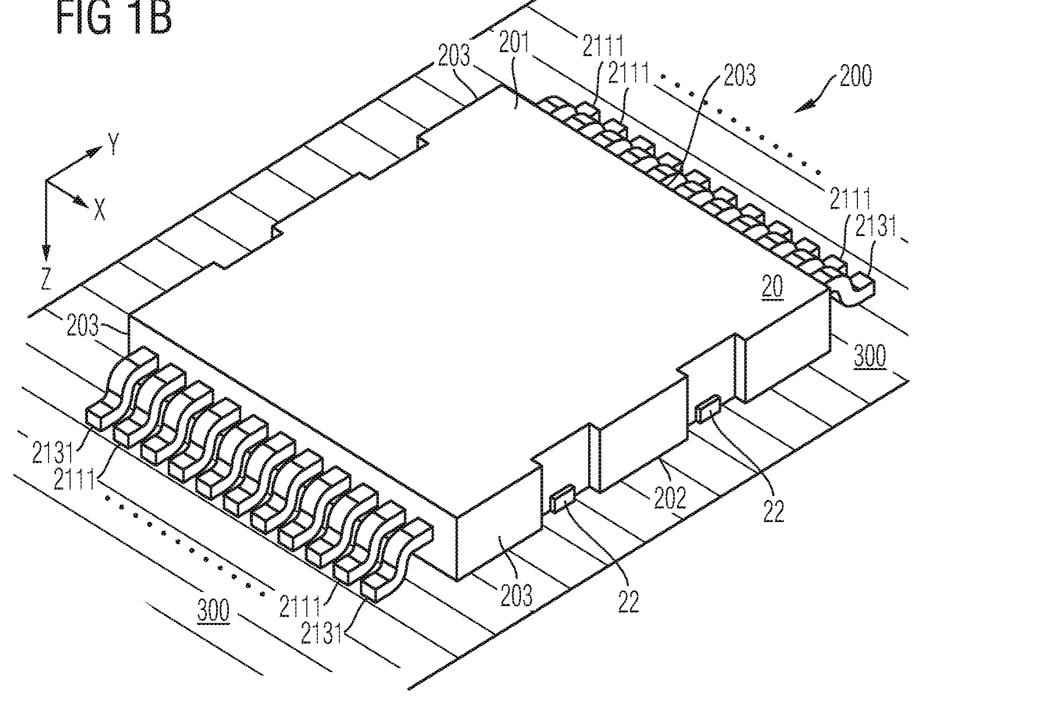

FIGS. 1A-B both schematically and exemplarily illustrate a section of a perspective projection of a package 200 in accordance with one or more embodiments. It will now be referred to both FIG. 1A and FIG. 1B.

The package 200 comprises a package body 20 with a package top side 201, a package footprint side 202 and package sidewalls 203, the package sidewalls 203 extending from the package footprint side 202 to the package top side 201.

The package body 20 can be made of or, respectively, comprise a molding mass. For example, the package body 20 exhibits a flat configuration, according to which: each of the package top side 201 the package footprint side 202 extend substantially horizontally along the first and second lateral directions X and Y; the package sidewalls 203 extend substantially vertically along the vertical direction Z; and a maximum horizontal extension of the package footprint side 202 amounts to at least twice of a maximum vertical extension of the package sidewalls 203.

A lead frame structure of the package 100 is configured for electrically and mechanically coupling the package 200 to a carrier 300 with the package footprint side 202 facing to the carrier 300.

The carrier 300 may be a printed circuit-board (PCB) or may be a component of a PCB. In another embodiment, the carrier 300 may be a Direct Copper Bond (DCB) substrate, e.g. a ceramic circuit board, or may be a component of a DCB substrate. In yet another embodiment, the carrier 300 may also be based on an Insulated Metallic Substrate (IMS). The carrier 300 may be made of an electrically insulating material, e.g., made of a polymer, a PCB laminate, a ceramic, a flame retardant (FR) material (e.g., FR4), a composite epoxy material (CEM), such as CEM1 or CEM3, a Bismaleimide-Triazine resin (BT) material, imide, polyimide, ABF, or made of a combination of the aforementioned exemplary materials.

In an embodiment, the package 200 is coupled to the carrier via the lead frame structure of the package 200.

The package 200 encloses a plurality of power semiconductor chips 100 electrically connected in parallel to each other, each power semiconductor chip 100 having a first load terminal 101 and a second load terminal 102 and being configured to block a blocking voltage applied between said load terminals 101, 102 and to conduct a chip load current between said load terminals 101, 102.

The explanation of the power semiconductor chip 100 presented above with respect to FIG. 2 may equally apply to each power semiconductor chip 100 included in the package 200.

In an embodiment, the chips 100 included in the package 200 are equally configured. For example, each chip 100 exhibits the same MOSFET configuration.

For example, the chips 100 are sandwiched in between the package top side 201 and the package footprint side 202. The package body 20 may entirely surround the chips 100 and seal the chips 200 against the environment. Further aspects of the arrangement of the chips 100 will be described below.

The lead frame structure of the package 200 may serve as an electrically conductive interface between the first load terminals 101 of the chips 100 (and, if present, the one or more further terminals of the chips (control and/or sense terminals) and other components (not illustrated) that are fixed at the carrier 300. For example, the carrier 300 may comprise or be provided with other components (not illustrated; for example, one or more other packages including one or more other chips, and/or a controller, a sensor, a passive component, a load or the like) to which the terminals of the chips 100 are to be coupled via the lead frame structure. A connection between the lead frame structure and the terminals of the chips 100, e.g., the first load terminals 101, may be realized by package internal connection means, and for connecting the chips with other components external of the package 200, the lead frame structure may comprise one or more outside terminals, as will now be explained in more detail further below.

As used herein, the formulation "electrically connected in parallel to each other" shall mean that all first load terminals 101 of the chips 100 enclosed in the package 200 exhibit the substantially the same first electrical potential, and that all second load terminals 102 of the enclosed chips 100 exhibit the substantially the same second electrical potential. For example, the total load current of the package is collectively and simultaneously conducted by the plurality of chips 100. Hence, said formulation is not intended to also encompass so-called anti-parallel connections (e.g., two anti-parallel connected diodes do not simultaneously conduct a load current).

For example, each chip 100 exhibits the same on-state resistance ($R_{on}$), and the total on-state resistance of the package 200 amounts hence to approximately $R_{on}$ divided by the total number of chips 100.

Figure 3:
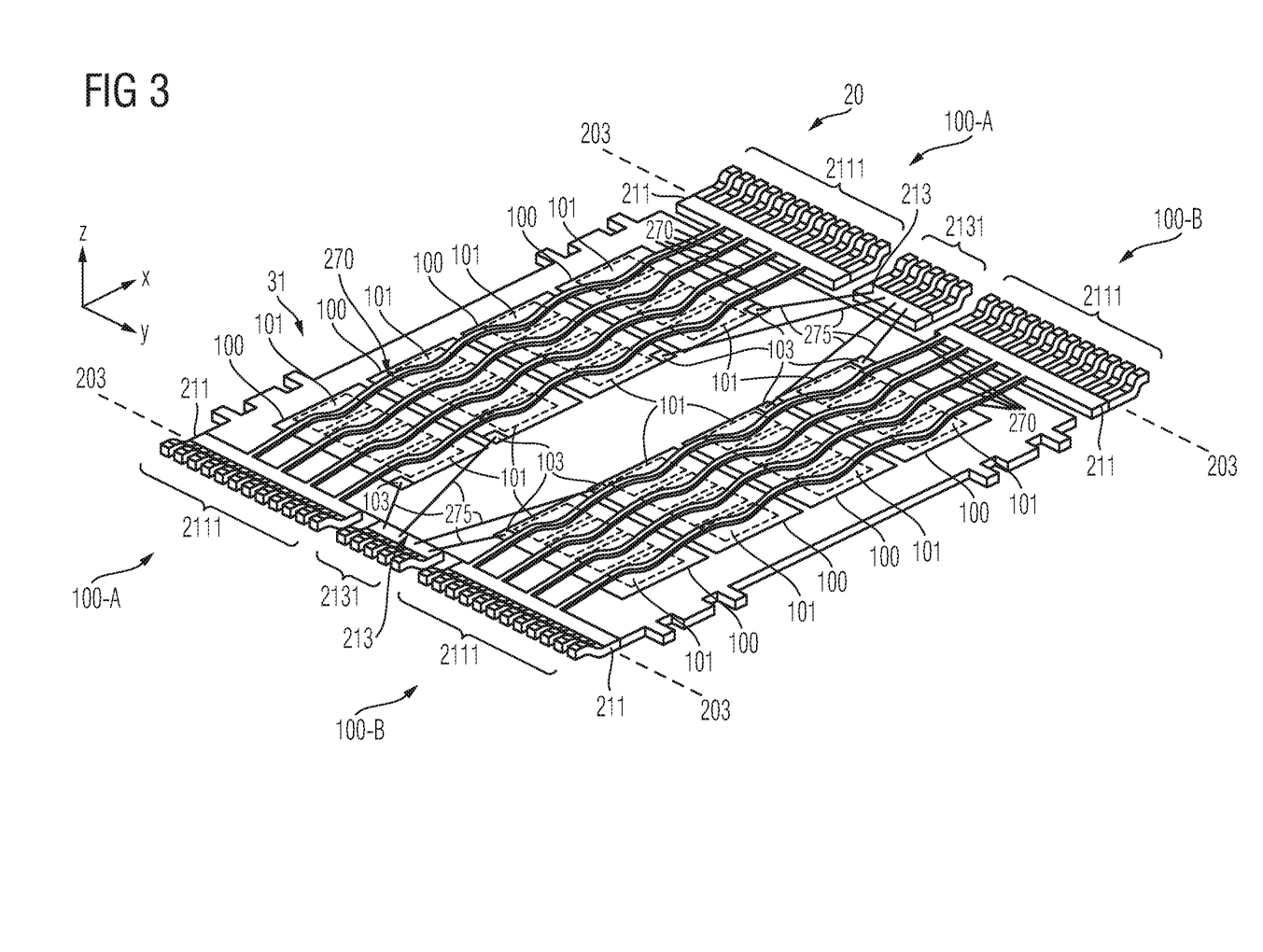
FIG. 3 schematically and exemplarily illustrates a section of a perspective projection of a package in accordance with one or more embodiments.

Now referring to both FIGS. 1A-B and 3, the lead frame structure 21 comprises a plurality of first outside terminals 2111. Each first outside terminal 2111 extends out of the package body 20 for interfacing with the carrier 300.

Each first load terminal 101 of the plurality of power semiconductor chips 100 is electrically connected, at least by means of one package body internal connection member 270, to at least two of the plurality of first outside terminals 2111.

For example, referring to FIG. 3, the package 200 integrates eight chips 100, which are arranged in basically two rows parallel to each other. The lead frame structure 21 comprises eight package body internal connection members 270.

In an embodiment, each package body internal connection member 270 is terminated by at least two first outside terminals 2111, and each package body internal connection member 270 is electrically connected to the first load terminals 101 of at least two chips (in the illustrated example to four chips 100). For example, each end of a respective connection member 270 terminates into at least one first outside terminal 2111.

For example, as illustrated in FIG. 3, at its ends, each package body internal connection member 270 may join, into a respective first load terminal bar 211 of the lead frame structure 21, which interfaces to a plurality of the first outside terminals 2111.

Furthermore, in an embodiment, each of the first outside terminals 2111 extends out of a either a first one of the package sidewalls 203 of the package body 20 or out of a second one of the package sidewalls 203 of the package body 20, the first package sidewall and the second package sidewall being arranged opposite to each other. Further, for each first load terminal 101 of the plurality of power semiconductor chips 100, at least one of said at least two first outside terminals 2111 that are provided for the respective first load terminal 101 extends out of the first package sidewall and at least another one of said at least two first outside terminals 2111 that are provided for the respective first load terminal 101 extends out of the second package sidewall.

For example, still referring to FIG. 3 as an example, each package body internal connection member 270 may laterally extend substantially from the first package sidewall 203 (e.g., in FIG. 3, the right one) to the opposite second package sidewall 203 (e.g., in FIG. 3, the left one) and, along the course of its lateral extension, establish electrical contact at least one first load terminal 101 of at least one of the chips 100. For example, along the course of its lateral extension, each package body internal connection member 270 establish electrical contact with the first load terminals 101 of at least two chips 100.

Thus, in more general terms, in accordance with an embodiment, said at least two first outside terminals 2111 that are provided for each first load terminal 101 are electrically connected to each other by means of said at least one package body internal connection member 270 within the package body 20.

For example, each package body internal connection member 270 is implemented as a wire-bond, as a clip or as a ribbon-bond.

The package body internal connection members 270 provide an electrically conductive path between the first load terminals 101 of the chips 100 and the first outside terminals 2111. As explained above, at each package sidewall 203, a subset of the first outside terminals 2111 may join into a respective first load terminal bar 211. Each first load terminal bar 211 may substantially extend in parallel to the package sidewall 203 and provide for an interface between the subset of the first outside terminals 2111 and one or more of the package internal connection members 270.

The control terminals 103 (not illustrated in FIG. 3) may be connected to in a similar manner. For example, the package 200 comprises a plurality of third outside terminals 2131. For example, at each of the first and the second package sidewall that are opposite to each other, the package 200 comprises at least one control terminal bar 213 that extends substantially in parallel to the respective package sidewall 203. At each sidewall 203, the third outside terminals 2131 join into the control terminal 213. Within the package body 20, a plurality of package internal control terminal connection members 275 are provided that extend from the control terminals bars 213 to the respective control terminals 103 of the package integrated chips 100. For example, the package 200 includes at least one package internal control terminal connection member 275 for each chip 100. Moreover, as shown in FIG. 3, e.g., the third outside terminals 2131 extend out of a central portion of the first and second package sidewall (central with respect to the second lateral direction Y) with a subset of first outside terminals 2111 extending out of the first and second package sidewall on either side of the third outside terminals 2131 in the second lateral direction Y. That is to say, in the example shown in FIG. 3 the packages comprises a symmetric pinning with respect to the third outside terminals 2131 being arranged in the middle and the first outside terminals 2111 on both sides thereof. For comparison, the examples illustrated e.g. in FIG. 4 has a symmetric pinning with respect to the first outside terminals 2111 being arranged in the middle with the third outside terminals 2131 on both sides thereof. Needless to say, also the arrangement shown in FIG. 3 can be adopted for top side cooling as shown in FIG. 1A as well as for bottom side cooling as shown in FIG. 1B.

For example, each package body internal control terminal connection member 275 is implemented as a wire-bond, as a clip or as a ribbon-bond.

Furthermore, as explained above, each control terminal bar 213 may provide for an interface between a subset of the third outside terminals 2131 and a subset of the package body internal control terminal connection members 275. Also, as explained above, each first load terminal bar 211 may provide for an interface between a subset of the first outside terminals 2111 and a subset of the package body internal connection members 270.

Now referring again also to FIGS. 1A-B, the package 200 comprises a horizontally extending conduction layer 22 at the package top side 201 (as illustrated in FIG. 1A) or at the package footprint side 202 (as illustrated in FIG. 1B), wherein the conduction layer 22 is electrically connected with each of the second load terminals 102 of the plurality of power semiconductor chips 100 that are integrated in the package 200. It is also possible that horizontally extending conduction layers are provided at both the package top side 201 and the package footprint side 202.

For example, the package 200 may hence exhibit a TSC configuration, as in FIG. 1A, or the package 200 may exhibit a BSC (Bottom Side Cooling or Board Side Cooling) configuration, as in FIG. 1B.

In both variants, the conduction layer 22 can be monolithic and may laterally overlap with each of the power semiconductor chips 100, e.g., in both the first and the second lateral direction X and Y.

For example, as best illustrated in FIG. 1A, the conduction layer 22 is arranged substantially coplanar with the package top side 201; e.g., the conduction layer 22 does substantially not protrude from the package top side 201. The conduction layer 22 can have a horizontal surface area amounting to at least 50%, to at least 60% or to even more than 80% or even more than 95% (but to less than 100%) of the total surface area of the package top side 201. This surface area may be exposed to the environment of the package body 20, i.e., the surface area of the conduction layer 22 is not enclosed within the package body 20, but forms a part of an exterior surface. This may apply analogously for the BSC configuration (cf. FIG. 1B).

The conduction layer 22 may be monolithic and extend continuously, i.e., as a contiguous electrically conductive surface, so as to entirely overlap (laterally/horizontally) which each of chips 100 integrated in the package 200. For example, every chip 100 is arranged within a vertical projection of the horizontal surface of the conduction layer 22. This exemplary configuration of the conduction layer 22 may also be true for the embodiment illustrated in FIG. 3 (where no conduction layer 22 is illustrated).

In another embodiment, as shown in FIG. 1B, the conduction layer 22 is arranged at the package footprint side 202 and, hence, the package 200 may then exhibit said bottom side cooling (BSC) configuration.

In an embodiment, as illustrated in FIGS. 1A-B and FIG. 3, each of the plurality of first outside terminals 2111 extends out of the package body 20 at a respective one of the package sidewalls 203. For example, the first outside terminals 2111 are arranged at two sidewalls 203 opposite to each, whereas the first outside terminals 2111 are not arranged at the remaining two sidewalls 203.

Furthermore, as also illustrated in FIGS. 1A-B and FIG. 3, each first outside terminal 2111 may be arranged at a vertically centered position of the respective sidewall 203. For example, this may beneficially allow using the same package 200 as either BSC or TSC package, depending on the orientation of the outside terminals 2111; these may hence either be orientated towards the conduction layer 22 (corresponding to a BSC configuration) or orientated towards the package top/bottom side 201/202 where the conduction layer 22 is not provided, yielding a TSC configuration.

The explanation of the optional arrangement of the first outside terminals 2111 in the preceding paragraph may likewise apply to the arrangement of the third outside terminal 2131, in accordance with an embodiment and as exemplarily illustrated in FIGS. 1A-B and FIG. 3.

In an embodiment, the lead frame structure 21 comprises, irrespective of the horizontally extending conduction layer 22, no outside terminal that extends out of the package body 20 and that is electrically connected with one or more the second load terminals 102 of the power semiconductor chips 100. For example, the first load terminals 101 of all chips 100 that are integrated in the package 200 are electrically contacted by a package external entity by means of the first outside terminals 2111, and the second load terminals 102 of all chips 100 that are integrated in the package 200 are electrically contacted by a package external entity by means of the horizontally extending conduction layer 22, and the control terminals 103 (if present) of all chips 100 that are integrated in the package 200 are electrically contacted by a package external entity by means of the third outside terminals 2131. In contrast, there is no outside terminal (like the terminals 2111, 2131) provided for the second load terminals 102.

In an embodiment, each of the power semiconductor chips 100 is arranged at the same vertical level within the package body 20. Further, each chip 100 can be arranged in the package body 20 such that its second load terminal 102 faces to the package footprint side 202 and such that its first load terminal 101 and its control terminal 103 face to the package top side 201.

For example, the package top side 201 has a total horizontal surface area of at least 4 cm$^2$. For example, each package sidewall 203 may exhibit a total lateral extension of at least 1 cm, at least 2 cm or at least 3 cm. An exemplary package dimension is 3.72 cm×4.716 cm.

Further, the package top side 201 can be exposed to the environment of the package body (20), such that the horizontal surface area of the conduction layer 22 is not enclosed within the package body 20, but forms a part of an exterior surface. This may apply analogously for the BSC configuration (cf. FIG. 1B).

In an embodiment, each power semiconductor chip 100 integrated in the package 200 is configured to block a blocking voltage of at least 500 V. Further, a static ohmic resistance measured, during conduction of the chip load currents, between the horizontally extending conduction layer 22 and the plurality of first outside terminals 2111 is less than 5 mOhm or even less than 1.5 mOhm. Such comparatively low resistance is achieved at least by means of the parallel connection of the plurality of chips 100.

Figure 4:
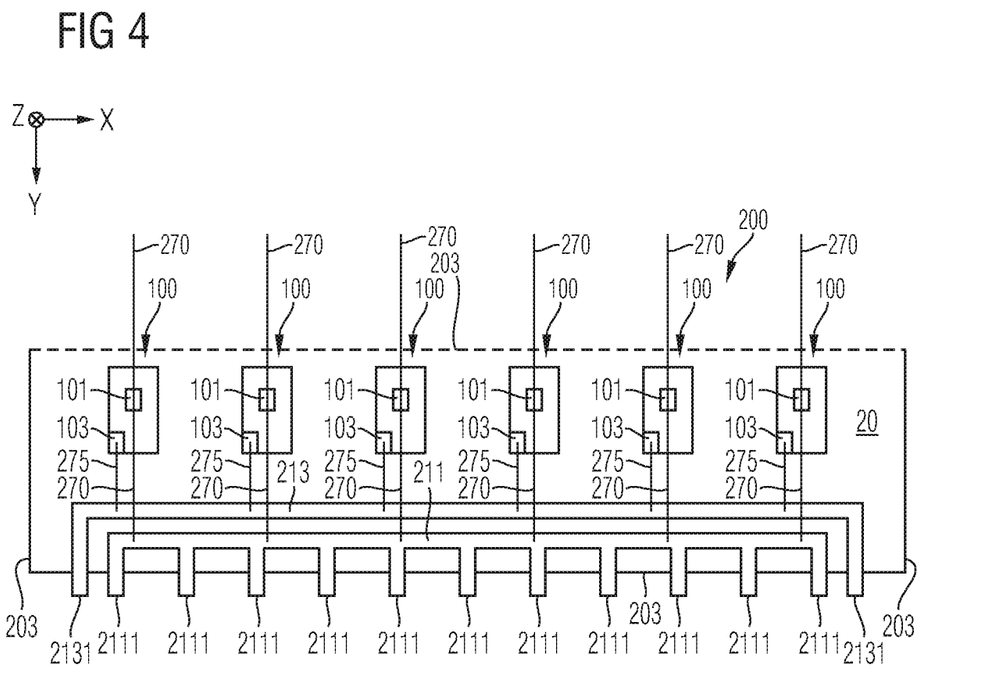
FIG. 4 schematically and exemplarily illustrates a section of a horizontal projection of a package in accordance with one or more embodiments.

In the following, it is referred to FIG. 4, which schematically and exemplarily illustrates a section of a horizontal projection of the package 200 in accordance with one or more embodiments. FIG. 4 illustrates a package section approximate to one (e.g., the first) package sidewall 203. The package section approximate to the second (opposite) package sidewall 203 may be configured identically, such that the package exhibits a symmetrical design.

As explained above, the lead frame structure may comprise the first load terminal bar 211 and the plurality of first outside terminals 2111 extending out of the package body 20 for interfacing with the carrier 300 and being electrically connected with the first load terminals 101 of at least some of the plurality of power semiconductor chips 100 by means of the first load terminal bar 211 and the package internal connection members 270. For example, at least one or at least two first outside terminals 2111 are provided for each power semiconductor chip 100.

If present, for electrical connection of the control terminals 103, the package 200 may comprise the least one third outside terminal 2131 extending out of the package body 20 for interfacing with the carrier 300 and being electrically connected with at least one of the control terminals 103 of the plurality of power semiconductor chips 100. As illustrated in FIGS. 1A-B, 3 and 4, there can of course be more than one third outside terminal 2131; e.g., two third outside terminals 2131. However, since controlling the power semiconductor chips 100 by means of supplying a control signal to the control terminals 103 does typically not require a high current, a few third outside terminals 2131 may be sufficient. For example, one or two third outside terminals 2131 are connected, within the package body 20, to the control terminals 103 of the enclosed power semiconductor chips 100, e.g., as explained above, at least by means of the package internal control terminal connection members 275.

According to the aforesaid, the first outside terminals 2111 are electrically insulated from the conduction layer 22. If present, the one or more third outside terminals 2131 are electrically insulated from both the first outside terminals 2111 and the conduction layer 22.

One or more or each of the outside terminals 2111 and 2131 may be configured to be electrically and mechanically coupled to the carrier 300, e.g., by soldering. Within the present specification, the term "outside" may express that the outside terminals 2111 and 2131 may be configured to be electrically contacted by means of components (entities) external of the package body 20.

Further, the outside terminals 2111 and 2131 may be designed as pins, as best illustrated in FIGS. 1A-B and 3. In another embodiment, e.g., for forming a so-called leadless package, the outside terminals 2111 and 2131 of the package 200 are flat planar outside terminals. For example, within the present specification, the term "flat planar" may express that the outside terminals 2111 and 2131 each exhibit a respective substantially plane bottom surface that has a size with horizontal dimensions (e.g. along each of the first lateral direction X and the second lateral direction Y) at least as great as a vertical dimension of the respective outside terminal (e.g. along the vertical direction Z), said plane bottom surface laterally overlapping with the package footprint side 202. Thus, the package 200 may be a leadless package, e.g., an SMD leadless package. In another embodiment, the outside terminals 2111 and 2131 are configured as contact pins (as illustrated) or as contact balls.

In the package body 20, the plurality of power semiconductor chips 100 are arranged horizontally adjacent to each other along the first lateral direction X. For example, in terms the vertical direction Z, each chip 100 has the same position. For example, each of the power semiconductor chips 100 is arranged at the same vertical level within the package body 20. The chips 100 may be arranged equidistantly, e.g., with distance within the range of 0.5 mm to 5.0 mm, along the first lateral direction X being present between each pair of adjacent chips 100.

The first load terminal bars 211 of the lead frame structure 21 may also extend along the first lateral direction X so as to allow for subsequently establish, by means of the package internal connection members 270, electrical contact to the first load terminals 101 of the power semiconductor chips 100.

The first load terminal bars 211 may be spatially displaced from the plurality of chips 100 along the second lateral direction Y (FIG. 4) or the first lateral direction (FIG. 3), e.g., by a distance within the range of 0.5 mm to 5.0 mm.

In an embodiment, the first outside terminals 2111 extend away from the first load terminal bar 211 (within the package body 20) along the first or second lateral direction X, Y so as to penetrate the package sidewall 203 and reach the exterior of the package 200 where they may interface with the carrier 300, as illustrated in FIGS. 1A-B, 3 and 4.

Hence, realization of the parallel connection of the plurality of chips 100 may at least partially be accomplished by means of the first load terminal bars 211 and the package internal connection members 270.

For example, the total lateral extension of each first load terminal bar 211 may be at least as great as the total lateral extension of the array formed by one or more of chips 100.

As explained above, the package internal control terminal connection members 275, e.g., wire bonds, connect the control terminals 103 of the power semiconductor chips 100 with the control terminal bars 213. The control terminal bars 213 may each be spatially displaced from the plurality of chips 100 along the first or second lateral direction X, Y, e.g., by a distance within the range of 0.5 mm to 5.0 mm.

In an embodiment, the third outside terminals 2131 extend away from the respective control terminal bar 213 (within the package body 20) along the first or second lateral direction X, Y so as to penetrate the package sidewall 203 and reach the exterior of the package 200 where they may interface with the carrier 300, as illustrated in FIGS. 1A-B, 3 and 4.

As illustrated in FIG. 4, the first load terminal bar 211 and the control terminal bar 213 can be arranged adjacent to each other along a second lateral direction Y. For example, due to the higher number of first outside terminals 2111 (as compared to the number of third outside terminals 2131), it may be appropriate to position the control terminal bar 213 between, with respect to the second lateral direction Y, the array of chips 100 and the first load terminal bar 211. For example, the package internal connection members 275 extend either below or above (with respect to the vertical direction Z) the control terminal bar 213 so as to connect to the first load terminal bar 211.

In an embodiment, the first load terminal bar 211 is positioned between, with respect to the first lateral direction X, the two third outside terminals 2131, as illustrated in FIG. 4.

FIG. 3, by contrast, shows a different approach, according to which, at each of the two opposite package sidewalls, the control terminal bar 213 is arranged between two first load terminal bars 211.

As explained above, the second load terminals 102 are electrically connected to the conduction layer 22. For example, the second load terminals 102 are exclusively electrically connected to the conduction layer 22, and no outside terminals (like terminals 2111 and 2131) are provided.

Figure 5:
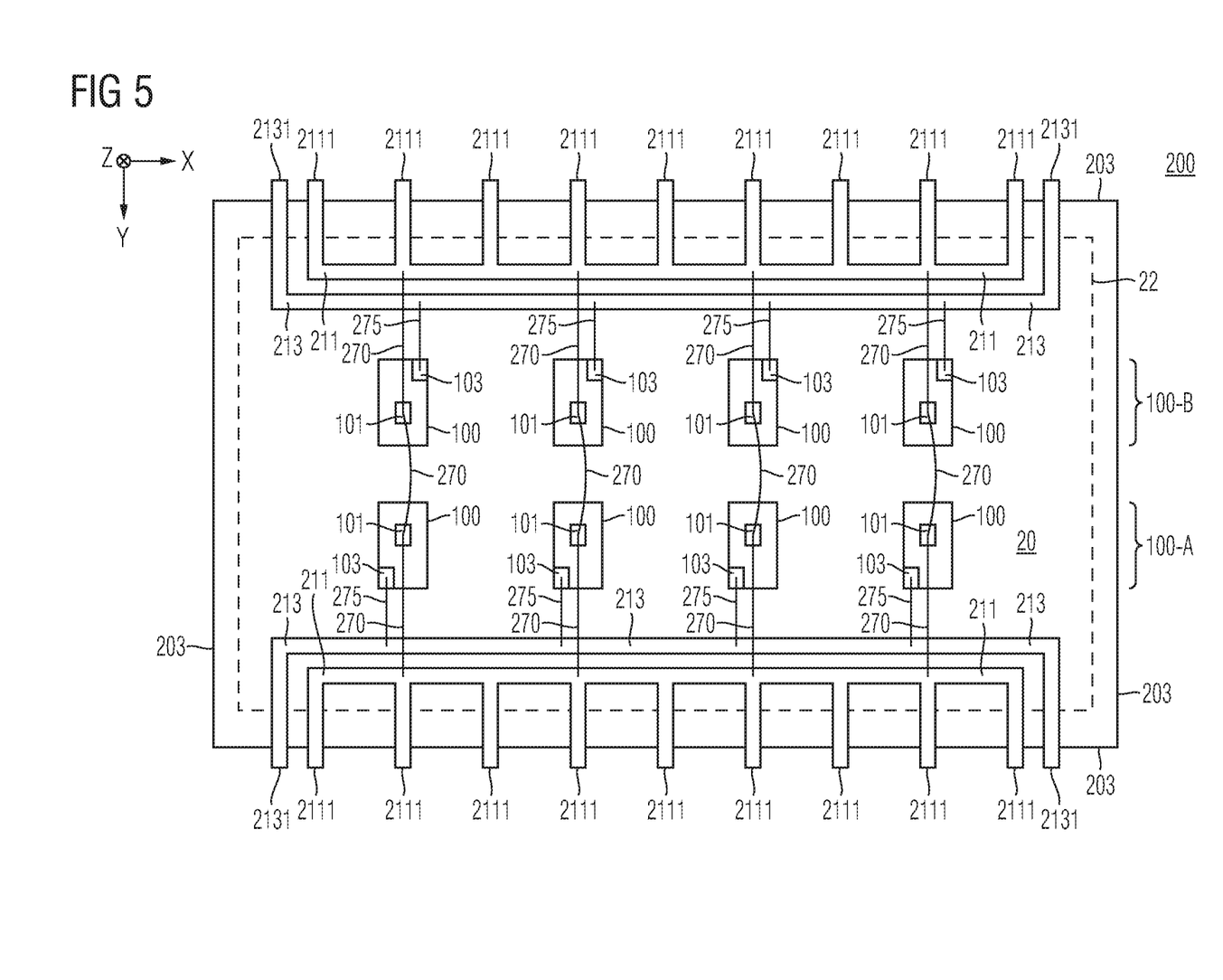
FIG. 5 schematically and exemplarily illustrates a section of a horizontal projection of a package in accordance with one or more embodiments.

FIG. 5 schematically and exemplarily illustrates a section of a horizontal projection of the package 200 in accordance with one or more further embodiments. Also referring to FIG. 3, for example, the plurality of power semiconductor chips 100 comprises a first subset of N>2 power semiconductor chips 100 and a second subset of N power semiconductor chips 100. For example, N equals to two, three, four, five, six, seven, eight, nine, or ten. N may even be greater than ten, e.g., equal to or greater than 12, 14 and so on. The total number of chips 100 included in the package 200 may hence be equal to 2*N.

FIGS. 3 and 5 illustrate embodiments with N=4

In an embodiment, the N power semiconductor chips 100 of the first subset are arranged along a first path 100-A that extends, e.g., in the first lateral direction X. Further, the N power semiconductor chips 100 of the second subset are arranged along a second path 100-B parallel to the first path 100-A and horizontally displaced therefrom, e.g., along the second lateral direction Y. Also, the N chips 100 of the second subset may be arranged in a manner as already explained with respect to FIG. 4. Each of the 2*N chips of the first and the second subset may have the same position with regards to the vertical direction Z.

The lead frame structure 21 of the package 200 may comprise at least one first load terminal bar 211 for both array of chips 100-A and 100-B, as illustrated in FIG. 3 (where two first load terminal bars 211 are provided for each path 100-A, 100-B) and in FIG. 5 (where one first load terminal bar 211 is provided for each path 100-A, 100-B).

The first load terminal bar(s) 211 for the first array of N chips 100-A extend(s) in parallel to the package sidewall(s) 203, e.g., so as to allow for the package internal connection members 275 to subsequently establish electrical contact with the first load terminals 101 of the N power semiconductor chips 100 of the first subset, e.g., in a manner as already explained with respect to FIGS. 3 and 4.

The further first load terminal bar(s) 211 for the N chips 100 of the second subset in the second array 100-B also extend(s) in parallel to the package sidewall(s) 203, e.g., so as to allow for the package internal connection members 275 to subsequently establish electrical contact with the first load terminals 101 of the power semiconductor chips 100 of the second subset, e.g., in a manner as already explained with respect to FIGS. 3 and 4.

For example, the first load terminal bar(s) 211 for the N chips 100 of the first array 100-A is/are arranged within the package body 20 and between the first array 100-A and a first one of the package sidewalls 203 or, respectively, an opposite second one of the package sidewalls 203. As illustrated, the further first load terminal bar(s) 211 for the N chips 100 of the second array 100-B may also be arranged between the second array 100-B and the first one of the package sidewalls 203 or, respectively, the opposite second one of the package sidewalls 203.

For example, as already explained above, the conduction layer 22 is used to provide, e.g., at the package top side 201, an electrical connection the second load terminals 102 of each of the 2*N power semiconductor chips 100. Hence, an external contact can be coupled to the conduction layer 22 and, within the package body 20, the conduction layer 22 is electrically connected to the second load terminals 102 of each of the 2*N power semiconductor chips 100.

In accordance with the embodiments of FIGS. 1A-B, 3, 4 and 5, the parallel connection of all 2*N power semiconductor chips 100 may be established by electrically connecting each of the first outside terminals 2111 with each other, wherein this electrical connection may also occur exterior of the package body 20. Further, the parallel connection of all 2*N power semiconductor chips 100 may be established by electrically connecting each of the third outside terminals 2131 with each other, wherein this electrical connection may also occur exterior of the package body 20.

In accordance with the embodiment of FIG. 5, the package 200 further includes the horizontally extending conduction layer 22 at the package top side 201. If arranged at the package top side, the horizontally extending conduction layer 22 can be a top side cooling layer. Hence, the package 200 of FIG. 5 may exhibit a TSC configuration. The horizontally extending conduction layer 22 may laterally overlap, along both the first and second lateral direction X and Y, with some or all (as illustrated) of the power semiconductor chips 100 included in the package 200.

Regarding all embodiments described herein, the power semiconductor chips 100 in the package 200 can be configured to be collectively set into a respective conducting state, e.g., by means of providing a corresponding control signal at the third outside terminals 2131, wherein the first outside terminals 2111 and the conduction layer 22 are configured to conduct at least the sum of the chip load currents during the conducting state. For example, during the conducting state, the total load current is equally distributed among the power semiconductor chips 100 included in the package 200; e.g., if 2*N power semiconductor chips 100 included in the package 200, during the conducting state, each chip 100 conducts a share of the total load current $I_{total}$ amounting to approximately $I_{total}/(2*N)$, herein referred to as chip load current.

The parallel connection of the chips 100 included in the package 200 allows achieving a comparatively low total on-state resistance of the chips 100 integrated within package 200. For example, the total on-state resistance of the chips 100 and the package 200, i.e., the total on-state resistance of the package 200 that integrates the chips 100 that are connected in parallel to each other can be equal to or smaller 5 mOhm, or smaller than 2 mOhm, or smaller than 1 mOhm.

Further, regarding all embodiments described herein, the package 200 may not only include the first outside terminals 2111 but, optionally, one or more third outside terminals 2131. The total number of the third outside terminals 2131 can be limited, e.g., to eight, four, three, or two. In addition, the package 200 may include a further outside terminal (not illustrated), e.g., a sense outside terminal that is electrically connected to one or more sense terminals of one or more of the enclosed chips 100, e.g., so as to be able to measure an operating parameter, such as a temperature, a voltage and/or the actual load current. However, it is again emphasized, that, in accordance with one or more embodiments, there is no other externally contactable electrical conductive member, in particular no outside terminal similar to the terminals 2111 and 2131, connected to the second load terminals 102 than the conduction layer 22.

As described above, the lead frame structure 21 of the package 200 comprises at least the first load terminal bar(s) 211 and the first outside terminals 2111. The lead frame structure 21 is configured to mechanically and electrically couple the package body 20 to the carrier 300 (e.g., a printed circuit board (PCB)).

In an embodiment, the lead frame structure 21 is a metallic frame structure; hence, the lead frame structure may constitute a metal carrier arranged partially in the interior of the package body 20 and partially external of the package body 20.

In accordance with a further embodiment, a method of processing a package is provided. The method includes:
Providing a package body with a package top side, a package footprint side and package sidewalls, the package sidewalls extending from the package footprint side to the package top side;
Arranging a plurality of power semiconductor chips in the package body and electrically connecting the chips in parallel to each other, each power semiconductor chip having a first load terminal and a second load terminal and being configured to block a blocking voltage applied between said load terminals and to conduct a chip load current between said load terminals;
Providing a lead frame structure for electrically and mechanically coupling the package to a carrier with the package footprint side facing to the carrier, the lead frame structure comprising a plurality of first outside terminals, wherein
each first outside terminal extends out of the package body for interfacing with the carrier;
each first load terminal of the plurality of power semiconductor chips is electrically connected, at least by means of one package body internal connection member, to at least two of the plurality of first outside terminals; and
Providing a horizontally extending conduction layer at the package top side or at the package footprint side, wherein the conduction layer is electrically connected with each of the second load terminals of the plurality of power semiconductor chips.

Exemplary embodiments of processing method correspond to the embodiments of the package 200 described above with respect to FIGS. 1A-b to FIG. 5. For example, the processing method may include ensuring that each of the power semiconductor chips is arranged, within the package body, at the same vertical level. Hence, the total thickness (e.g., the distance between the package top side and the package footprint side) of the package does not depend on the total number of chips included in the package.

For example, even though the processed package may hence include a plurality of chips electrically connected in parallel to each other, existing package processing platforms may be used. For example, existing die/wire bond platforms may be employed for forming the embodiments of the package 200 described above with respect to FIGS. 1A-B to FIG. 5.

Figure 6:
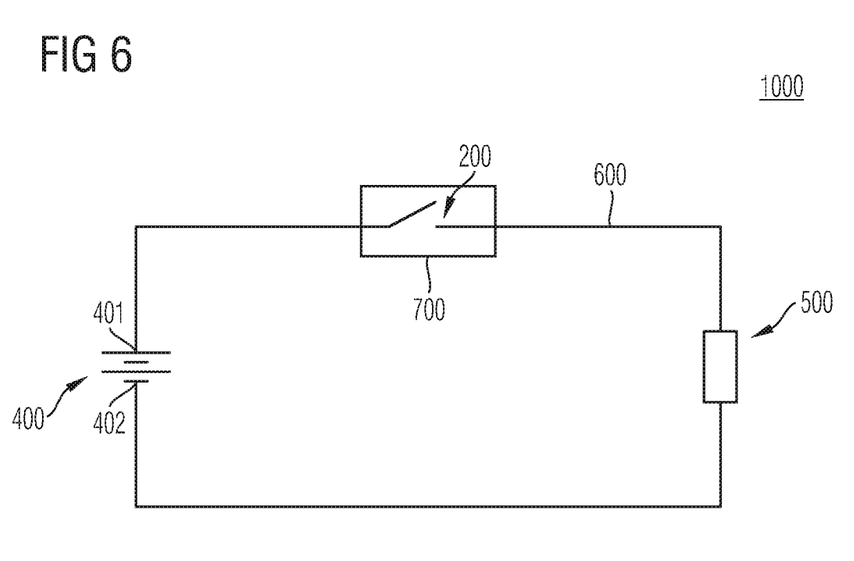
FIG. 6 schematically and exemplarily illustrates a section of a circuit diagram of a system in accordance with one or more embodiments.

In the following, it will be referred to FIG. 6, which schematically and exemplarily illustrates a section of a circuit diagram of a system 1000 in accordance with one or more embodiments.

The system 1000 is configured to supply a load current to a load 500. The load 500 can be constituted by an electric system of a vehicle, for example. For example, the load may comprise an electric drive of the vehicle, e.g., for driving the vehicle itself or an electric brake and/or one or more other electric components of the vehicle.

The system 1000 comprises a power supply 400 that provides a power supply signal at power supply terminals 401, 402. The power supply 400 can for example be a DC power supply, e.g., including a battery supplying a DC voltage between power supply terminals 401 and 402. The power supply 400 may alternatively or additionally comprise a (non-illustrated) power semiconductor converter circuit providing the power supply signal at the power supply terminals 401, 402, e.g., a DC voltage of at least 100 V.

The system 1000 further comprises a power supply path 600 for coupling the power supply 400 to the load 500. The power supply path 600 may include one or more of following: one or more cables, one or more wires, one or more connectors, one or more copper lines etc.

A system main switch 700 is arranged in the power supply path 600. The system main switch 700 can be configured to selectively set the power supply path 600 into a blocking state (i.e., such that the power supply path 600 is interrupted and no load current can be supplied from the power supply 400 to the load 500) and a conducting state, during which the power supply path 600 is conductive and the load 500 can be supplied with the load current generated by the power supply 400. Hence, if the system main switch 700 is closed (i.e., ON), the system main switch conducts the load current currently drawn by the load 500.

For example, the system main switch 700 can be a battery main switch. For example, the system main switch 700 is operated at a comparatively low switching frequency, e.g., of less than 1 Hz. A main switch is typically not operated continuously with a constant switching frequency, but irregularly, e.g., only several times a day (in case of use as a battery main switch in a vehicle, for example).

The system main switch 700 comprises one or more packages 200 in accordance with one or more embodiments described above. The one or more packages 200 are configured to conduct the load current supplied to the load 500.

Hence, a beneficial application of the embodiments of the package 200 described above may be its use within a main switch, such as a battery main switch. Such switches typically require very low static losses due long lasting on-states that may occur (e.g. for several hours or even for several days). In contrast, such applications do typically not require very low switching losses, since the switching events are rather rare. Thus, embodiments of the package 200 described above may be used to replace conventional main switches, such as relays, contactors or the like.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A package, comprising:
a package body with a package top side, a package footprint side and package sidewalls, the package sidewalls extending from the package footprint side to the package top side;
a plurality of power semiconductor chips electrically connected in parallel to each other, each power semiconductor chip having a first load terminal and a second load terminal and being configured to block a blocking voltage applied between the first and second load terminals and to conduct a chip load current between the first and second load terminals;
a lead frame structure configured to electrically and mechanically couple the package body to a carrier with the package footprint side facing the carrier, the lead frame structure comprising a plurality of first outside terminals, wherein:
each first outside terminal extends out of the package body for interfacing with the carrier; and
each first load terminal of the plurality of power semiconductor chips is electrically connected, at least by one package body internal connection member, to at least two of the plurality of first outside terminals; and
a horizontally extending conduction layer at the package top side or at the package footprint side, wherein the conduction layer is electrically connected with each of the second load terminals of the plurality of power semiconductor chips.

2. The package of claim 1, wherein the conduction layer is monolithic and overlaps horizontally with each of the power semiconductor chips.

3. The package of claim 1, wherein each of the plurality of power semiconductor chips is controllable and comprises a respective control terminal.

4. The package of claim 3, wherein the lead frame structure comprises a plurality of control outside terminals for interfacing with the carrier, and wherein each of the plurality of control outside terminals is electrically connected with a control terminal of at least one of the plurality of power semiconductor chips.

5. The package of claim 3, wherein each power semiconductor chip has a vertical configuration according to which its first load terminal and its control terminal are arranged at a chip front side and its second load terminal is arranged at a chip backside, and wherein each power semiconductor chip is arranged in the package such that its chip front side faces the package top side.

6. The package of claim 1, wherein each of the power semiconductor chips is arranged at a same vertical level within the package body.

7. The package of claim 1, wherein the lead frame structure comprises, irrespective of the horizontally extending conduction layer, no outside terminal that extends out of the package body and that is electrically connected with one or more the second load terminals of the power semiconductor chips.

8. The package of claim 1, wherein:
each of the first outside terminals extends out of a either a first one of the package sidewalls of the package body or out of a second one of the package sidewalls of the package body, the first package sidewall and the second package sidewall being arranged opposite to each other;
for each first load terminal of the plurality of power semiconductor chips, at least one of the at least two first outside terminals that are provided for the respective first load terminal extends out of the first package sidewall and at least another one of the at least two first outside terminals that are provided for the respective first load terminal extends out of the second package sidewall.

9. The package of claim 8, wherein the at least two first outside terminals that are provided for each first load terminal are electrically connected to each other by the at least one package body internal connection member within the package body.

10. The package of claim 1, wherein the package top side has a total horizontal surface area:
of at least 4 cm$^2$; and/or
that is exposed to the environment of the package body, such that the horizontal surface area of the conduction layer is not enclosed within the package body, but forms a part of an exterior surface.

11. The package of claim 1, wherein the horizontally extending conduction layer:
is monolithic; and/or
laterally overlaps with each of the power semiconductor chips; and/or
is arranged substantially coplanar with the package top side; and/or
does not laterally protrude from the package top side; and/or
has a horizontal surface area amounting to at least 50%, to at least 60% or to more than 80%, but to less than 100% of the total horizontal surface area of the package top side.

12. The package of claim 1, wherein each power semiconductor chip is configured to block a blocking voltage of at least 500 V.

13. The package of claim 1, wherein a static ohmic resistance measured, during conduction of the chip load currents, between the horizontally extending conduction layer and the plurality of first outside terminals is less than 5 mOhm.

14. The package of claim 1, wherein each power semiconductor chip has a vertical configuration according to which its first load terminal and its control terminal are arranged at a chip front side and its second load terminal is arranged at a chip backside, and wherein each power semiconductor chip is arranged in the package such that its chip front side faces to the package top side.

15. The package of claim 1, wherein the plurality of power semiconductor chips comprises a first subset of N>2 power semiconductor chips and a second subset of N power semiconductor chips, wherein the power semiconductor chips of the first subset are arranged along a first path, and wherein the power semiconductor chips of the second subset are arranged along a second path parallel to the first path and horizontally displaced therefrom.

16. The package of claim 1, wherein each of the plurality of first outside terminals extends out of the package body at a respective one of the package sidewalls.

17. The package of claim 16, wherein each first outside terminal is arranged at a vertically centered position of the respective sidewall.

18. A system for supplying a load current to a load, the system comprising:
a power supply;
a power supply path configured to couple the power supply to the load; and
a system switch in the power supply path,
wherein the system switch comprises one or more packages of claim 1,
wherein the one or more packages are configured to conduct the load current at least partially.

* * * * *

UNITED STATES PATENT AND TRADEMARK OFFICE
CERTIFICATE OF CORRECTION

PATENT NO. : 11,355,424 B2
APPLICATION NO. : 17/012198
DATED : June 7, 2022
INVENTOR(S) : R. Otremba et al.

It is certified that error appears in the above-identified patent and that said Letters Patent is hereby corrected as shown below:

In the Claims

Column 18, Line 55 (Claim 7), please change "more the" to -- more of the --.

Column 18, Line 58 (Claim 8), please change "of a either" to -- of either --.

Signed and Sealed this
Sixteenth Day of August, 2022

Katherine Kelly Vidal
*Director of the United States Patent and Trademark Office*